(12) United States Patent
Heikkila et al.

(10) Patent No.: US 6,700,926 B1
(45) Date of Patent: Mar. 2, 2004

(54) METHOD AND APPARATUS PROVIDING BIT-TO-SYMBOL MAPPING FOR SPACE-TIME CODES

(75) Inventors: Markku J. Heikkila, Oulu (FI); Jorma Lilleberg, Oulu (FI)

(73) Assignee: Nokia Corporation, Espoo (FI)

( * ) Notice: Subject to any disclaimer, the term of this patent is extended or adjusted under 35 U.S.C. 154(b) by 656 days.

(21) Appl. No.: 09/710,936

(22) Filed: Nov. 13, 2000

Related U.S. Application Data

(63) Continuation-in-part of application No. 09/458,323, filed on Dec. 10, 1999.

(51) Int. Cl.$^7$ ............................... H04B 1/38; H04L 5/16
(52) U.S. Cl. ..................... 375/221; 375/267; 375/299; 375/308; 455/69; 455/101
(58) Field of Search .................. 375/259, 219, 375/221, 267, 299, 260, 347, 261, 298, 279, 308; 455/61, 65, 69, 101, 102, 272

(56) References Cited

U.S. PATENT DOCUMENTS

| | | | | |
|---|---|---|---|---|
| 4,597,090 A | * | 6/1986 | Forney, Jr. ................... | 375/261 |
| 4,601,044 A | * | 7/1986 | Kromer et al. ............. | 375/286 |
| 5,105,442 A | * | 4/1992 | Wei ............................. | 375/262 |
| 5,289,501 A | * | 2/1994 | Seshadri et al. ............ | 375/286 |
| 5,428,643 A | * | 6/1995 | Razzell ........................ | 375/308 |
| 5,479,448 A | | 12/1995 | Seshadri ...................... | 375/267 |
| 5,602,875 A | * | 2/1997 | Mantel et al. ............... | 375/264 |
| 5,828,695 A | | 10/1998 | Webb ........................... | 375/219 |
| 6,115,427 A | | 9/2000 | Calderbank et al. ........ | 375/267 |
| 6,298,092 B1 | | 10/2001 | Heath, Jr. et al. ........... | 375/267 |
| 6,490,270 B1 | | 12/2002 | Krishnamoorthy et al. . | 370/347 |

FOREIGN PATENT DOCUMENTS

| | | | |
|---|---|---|---|
| EP | 0 544 463 A2 | 6/1993 | .......... H04L/27/18 |
| WO | WO 97/41670 | 11/1997 | .......... H04L/23/02 |
| WO | WO 99/17509 | 4/1999 | .......... H04L/27/18 |

OTHER PUBLICATIONS

"Space–Time Codes for High Data Rate WirelessCommunication: Performance Criterion and Code Construction", by Vahid Tarokh et al., IEEE Transactions on Information Theory, Vol 44., No. 2, Mar. 1998.pp. 744–765.
Proakis: "Digital Communications", 3$^{rd}$ Edition, pp. 174–179.

* cited by examiner

Primary Examiner—Phoung Phu
(74) Attorney, Agent, or Firm—Harrington & Smith, LLP

(57) ABSTRACT

A method for optimizing a bit-to-symbol mapping operation. The method has steps of (a) determining a most probable symbol selection error made during a space-time decoding operation; and (b) selecting a bits-to-symbol mapper such that a bit-to-symbol mapping step results in a most probable symbol selection error, made during a space-time decoding operation, causes a minimal number of bit errors. The bits-to-symbol mapping step can be carried out so as to minimize an average number of bit errors resulting from an occurrence of the most probable symbol selection error, as well as from an occurrence of at least a second most probable symbol selection error, during the space-time decoding operation. A space-time coded communications system that operates in accordance with the method is also disclosed.

19 Claims, 5 Drawing Sheets

|   | 0 | 1 | 2 | 3 | 4 | 5 | 6 | 7 |
|---|---|---|---|---|---|---|---|---|
| 0 |   | 15535 | 8043 | 16100 | 1130 | 16015 | 7908 | 15560 |
| 1 | 15463 |   | 15323 | 7812 | 15897 | 1140 | 15735 | 7836 |
| 2 | 7995 | 15328 |   | 15556 | 7755 | 15687 | 1130 | 15975 |
| 3 | 15872 | 7798 | 15335 |   | 15273 | 7843 | 15848 | 1081 |
| 4 | 1109 | 15906 | 7789 | 15256 |   | 15487 | 7774 | 15832 |
| 5 | 15718 | 1085 | 16074 | 7875 | 15362 |   | 15407 | 7789 |
| 6 | 7853 | 15936 | 1078 | 15969 | 7824 | 15247 |   | 15613 |
| 7 | 15302 | 7956 | 15829 | 1098 | 15627 | 7863 | 15626 |   |

|   | 0 | 1 | 2 | 3 | 4 | 5 | 6 | 7 |
|---|---|---|---|---|---|---|---|---|
| 0 |   | 354 | 520 | 927 | 203 | 912 | 528 | 371 |
| 1 | 359 |   | 337 | 566 | 964 | 236 | 941 | 522 |
| 2 | 511 | 380 |   | 370 | 594 | 860 | 250 | 952 |
| 3 | 949 | 559 | 355 |   | 367 | 569 | 915 | 243 |
| 4 | 253 | 998 | 568 | 371 |   | 367 | 578 | 938 |
| 5 | 1035 | 253 | 943 | 576 | 360 |   | 353 | 585 |
| 6 | 579 | 970 | 210 | 964 | 536 | 359 |   | 345 |
| 7 | 370 | 579 | 1030 | 241 | 872 | 578 | 358 |   |

|   | 0 | 1 | 2 | 3 |
|---|---|---|---|---|
| 0 |   | 123112 | 17109 | 123122 |
| 1 | 122975 |   | 122892 | 17026 |
| 2 | 17013 | 122367 |   | 123341 |
| 3 | 123354 | 16883 | 123563 |   |

FIG.8A

|   | 0 | 1 | 2 | 3 |
|---|---|---|---|---|
| 0 |   | 101096 | 135929 | 100434 |
| 1 | 101074 |   | 100658 | 135012 |
| 2 | 135389 | 100334 |   | 100937 |
| 3 | 100404 | 135621 | 100918 |   |

FIG.8B

|   | 0 | 1 | 2 | 3 |
|---|---|---|---|---|
| 0 |   | 110917 | 145352 | 92218 |
| 1 | 112057 |   | 91867 | 144703 |
| 2 | 145459 | 91714 |   | 111350 |
| 3 | 91612 | 144987 | 111687 |   |

FIG.8C

|   | 0 | 1 | 2 | 3 |
|---|---|---|---|---|
| 0 |   | 139220 | 147096 | 133954 |
| 1 | 139018 |   | 133513 | 147193 |
| 2 | 146796 | 133737 |   | 139152 |
| 3 | 133992 | 146699 | 139533 |   |

METHOD AND APPARATUS PROVIDING BIT-TO-SYMBOL MAPPING FOR SPACE-TIME CODES

CROSS-REFERENCE TO A RELATED PATENT APPLICATION

This patent application is a continuation-in-part of U.S. patent application Ser. No. 09/458,323, filed on Dec. 10, 1999, the disclosure of which is incorporated by reference herein in its entirety in so far as it does not conflict with the disclosure of this patent application.

FIELD OF THE INVENTION

This invention relates generally to wireless telecommunications systems and, more particularly, to digital radio communications system that employ space-time encoding of bits to symbols.

BACKGROUND OF THE INVENTION

In conventional digital radio communications systems data bits to be transmitted to a receiver are processed by first mapping a block of K bits to a data symbol (bit-to-symbol mapping), where for a set of K bits $2^K$ symbols are required. The symbol represents one specific point in a signal constellation, also referred to as a signal space diagram. In most cases the data bits have been encoded by a channel encoder and, in some cases, the symbols obtained after the bit-to-symbol mapping are then operated on by a further encoder. One example is so-called space-time coding.

In a typical implementation well-known Gray encoding is used for the bits-to-symbol mapping (see, for example, Proakis: Digital Communications, 3rd Edition, pages 175–178, and FIG. 2 herein.) After Gray encoding, adjacent constellation points in the signal space diagram are assigned bit combinations that differ in only one bit position. This is advantageous, as in traditional transmission methods the most probable error is made by selecting a symbol that is closest to the correct symbol (in Euclidean distance), and thus only a one bit error results from the selecting the wrong symbol.

In the space-time coding approach the data symbols are encoded such that an input data symbol stream generates one encoded symbol stream for transmission from individual ones of a plurality of antennas. At a receiver antenna, the received signal contains the sum of the signals transmitted from the plurality of antennas, each being affected by the radio channel. In addition, the received signal is typically corrupted by noise and interference. The receiver operates to generate symbol decisions on the data symbols using the signal received by the receiver antenna(s).

In general, the signal constellation is defined by the modulation that is employed (e.g., 8-PSK), and the space-time codes that are employed are designed for the selected type of modulation and, thus, for the corresponding signal constellation.

The Gray encoding used for bit-to-symbol mapping is, however, not necessarily always the most optimum method for use in a space-time coding embodiment. However, the inventors are not aware of any superior technique that has been proposed to replace Gray encoding.

General reference with regard to space-time coding can be made to WO 9741670 A1, which also discusses code construction. However, this publication does not specifically address the problem of bit-to-symbol mapping and, in fact, an unoptimized bit-to-symbol mapping appears to be used.

OBJECTS AND ADVANTAGES OF THE INVENTION

It is a first object and advantage of this invention to provide an improved technique for implementing bit-to-symbol mapping for use in a space-time encoder.

It is a further object and advantage of this invention to provide a bit-to-symbol mapping technique that is optimized for a particular application, and that may consider, for example, actual symbol selection errors, a type of modulation that is in use, and radio channel characteristics.

SUMMARY OF THE INVENTION

The foregoing and other problems are overcome and the objects of the invention are realized by methods and apparatus in accordance with embodiments of this invention.

A method is disclosed for optimizing a bit-to-symbol mapping operation. The method has steps of (a) determining a most probable symbol selection error made during a space-time decoding operation; and (b) selecting a bits-to-symbol mapper such that a bit-to-symbol mapping step results in a most probable symbol selection error, made during a space-time decoding operation, causes a minimal number of bit errors. The bits-to-symbol mapping step can be carried out so as to minimize an average number of bit errors resulting from an occurrence of the most probable symbol selection error, as well as from an occurrence of at least a second most probable symbol selection error, during the space-time decoding operation. Even further optimizations based on third most probable symbol selection errors, fourth most probable symbol selection errors, etc., may also be done.

The bits-to-symbol mapping operation is preferably followed by a space-time encoding operation.

The step of determining the most probable symbol selection error can include at least one of a step of modelling a communications channel, as well as the receiver, and/or considering a type of modulation used when transmitting the bits-to-symbol mapped signal through a communications channel. A space-time coded communications system that operates in accordance with the method is also disclosed.

BRIEF DESCRIPTION OF THE DRAWINGS

The above set forth and other features of the invention are made more apparent in the ensuing Detailed Description of the Invention when read in conjunction with the attached Drawings, wherein:

FIGS. 8A, 8B, 8C and 8D are tables showing an observed number of symbol error events after decoding 4-state, 8-state, 16-state and 32-state space-time codes, respectively, that were each 4-PSK modulated and transmitted with two transmitter antennas, where again the rows define the correct symbol index, and where columns define the index of the erroneous symbol in favor of which the error was made.

DETAILED DESCRIPTION OF THE INVENTION

Figure 1:
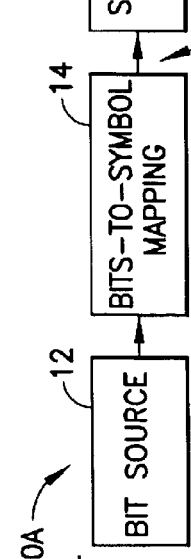
FIG. 1 is simplified block diagram of a two transmit antenna, two receive antenna space-time coded system that is suitable for practicing this invention.

FIG. 1 illustrates a simplified transmitter-receiver chain 10 that uses space-time coding, and that employs a mapping from bits to symbols. The transmitter-receiver chain 10 may represent a mobile station, such a cellular radio telephone or a wireless packet data terminal, as well as a base station or base site. Exemplary embodiments include a wide bandwidth code division, multiple access (WCDMA) mobile station/base station pair, or a time division, multiple access (TDMA) Global System for Mobile Communication (GSM) mobile station/base station pair.

On the transmit side 10A a bit source 12 provides input bits (either a serial bit stream or a succession of bits in parallel) to a bits-to-symbol mapping block 14. The symbols output from the bits-to-symbol mapping block 14 are applied to a space-time encoder 16 that provides inputs to first and second transmitters 18A and 18B, and thus to corresponding transmit antennas 19A and 19B. The bit source 12 could represent, for example, a source of digitized voice data, or it could represent a source of packet data.

In general, it should be realized that the functionality of the bits-to-symbol mapping block 14 can be incorporated into or embedded within the space-time encoder 16.

On the receive side 10B first and second receive antennas 20A and 20B provide inputs to a receiver front end 22. The receiver front end 22 has first and second outputs coupled to a space-time decoder 24 (that corresponds to the space-time encoder 16). The output of the space-time decoder 24 represents detected data symbols that are applied to a symbol-to-bits mapping block 26, the output of which is detected bits 26A that correspond, ideally, with the bits output from the bit source 12.

In general, it should be realized that the functionality of the symbol-to-bits mapping block 26 can be incorporated into or embedded within the space-time decoder 24.

In accordance with the teachings of this invention the bits-to-symbols mapping block 14 is operated so as to take into consideration the specifics of the operation of the space-time encoder 16, thereby outputting symbols that are optimized for space-time encoding. Bit patterns differing only in one bit position are assigned for those data symbols between which erroneous symbol decisions are most likely to be made by the receiver side 10B, specifically the space-time decoder block 24. After this operation, if the bits-to-symbol mapping is not fully defined, the second most probable symbol errors are considered by selecting from the remaining mapping possibilities one that minimizes the average number of bit errors made due to symbol errors. This process continues until there are no remaining degrees of freedom in the bits-to-symbol mapping process performed by mapping block 14. With certain space-time codes applied by the encoder 16 the optimal bits-to-symbol mapping process differs from the conventional Gray encoding. That is, the most probable error made by the symbol-to-bits mapping block 26 does not necessarily favor the symbol which is the closest (in Euclidean distance) to the correct symbol. In addition, space-time codes designed for a specific modulation method may enable further optimization of the bits-to-symbol mapping process carried out by the bits-to-symbol mapping block 14.

The space-time code dependent selection of the bits-to-symbol mapping process carried out by block 14 may also take into account the effects of algorithms used in the transmitter 10A and/or the receiver 10B, as well as the effects of the characteristics of the radio channel, including interference and noise. One technique for implementing these teachings is to determine the probabilities that decide in favor of symbol $S_i$, when $S_j$ is the correct symbol. A preferred approach models the complete communication chain in a desired operating environment. The obtained probability information is then used for optimizing the operation of the bits-to-symbol mapping block 14.

Figure 2:
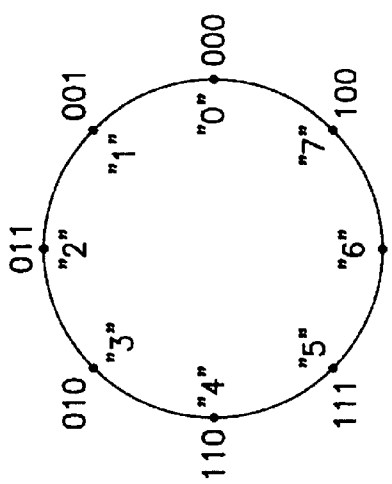
FIG. 2 depicts an exemplary Gray encoded bit mapping for an 8 Phase Shift Keying (8-PSK) constellation, wherein symbol indices are shown within the circle.

Describing the teachings of this invention now in further detail, reference is made first to FIG. 2., which shows one realization of a conventional Gray-encoded 8-PSK symbol constellation. Each constellation point carries (encodes) the information of the three bits listed outside the circle. It can clearly be seen that adjacent symbols in the constellation differ from one another in only one bit position.

Figures 3A, 3B, 3C:
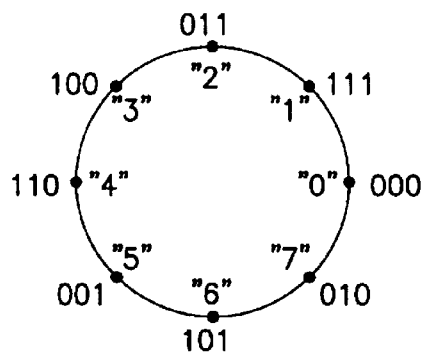
FIGS. 3A and 3B are tables showing an observed number of symbol error events after decoding 8-state and 16-state space-time codes, respectively, that were 8-PSK modulated and transmitted with two transmitter antennas, where rows define the correct symbol index, and where columns define the index of the erroneous symbol in favor of which the error was made.
FIG. 3C depicts an optimized bit-to-symbol mapping for the 8-state space-time code for 8-PSK modulation and two transmit antennas case of FIG. 3A, the Figure showing the bit patterns assigned for each constellation point indexed as 0, 1, 2, 3, . . . , 7.

In FIG. 3A the counts of symbol errors between all possible symbol pairs are listed for an 8-state space-time code (STC) designed for 8-PSK modulation and the two transmitter antennas 19A and 19B, with a simulation chain modelling the desired communication system and operational environment (e.g., a GSM-type Enhanced General Packet Radio System (EGPRS) EDGE system using 8-PSK modulation. Note should be made that the space-time trellis codes used in this and in the other following examples are taken from V. Tarokh, N. Seshadri and A. R. Calderbank, *Space-time codes for high data rate wireless communication: performance criterion and code construction,* IEEE Transactions on Information Theory, vol. 44, pp. 744–765, March 1998.

An examination of the results of the simulation basically entails counting all possible symbol error events during the simulation. It can be noticed that the most probable errors are not made in the adjacent symbols, but in those symbols that are either $3\Pi/8$ radians or $-3\Pi/8$ radians apart from the correct symbol (the error counts for these symbols are very close together, justifying the assumption that their probabilities are equal for the purpose of bit-to-symbol mapping optimization). This observation is true regardless of which symbol is the correct symbol. For this reason the traditional Gray encoding is suboptimal, and an optimized bit-to-symbol mapping is shown in FIG. 3C.

In the mapping of FIG. 3C the symbol pairs of the correct symbol and a symbol in which a symbol decision error is made with the highest probability are assigned bit patterns differing only in one bit position. However, because the observed error counts for the most probable symbol errors are very close to the error counts for the errors made with respect to an adjacent symbol, it is possible that in a different radio channel and/or with a different simulation condition the traditional Gray encoding may prove to be optimal for this particular case.

FIG. 3B illustrates the corresponding results for a 16-state code designed for 8-PSK modulation and the two transmitter antennas 19A and 19B of FIG. 1. It can be seen that in this case the most probable symbol error is made to the symbol that is ±3Π/4 radians from the correct symbol, and this is true for all symbols.

Thus, in accordance with the teachings of this invention those symbols that are 3Π/4 radians apart in the constellation are assigned bit sequences differing in only one bit position. An optimized signal constellation that results from this mapping is shown in FIG. 4.

Figure 4:
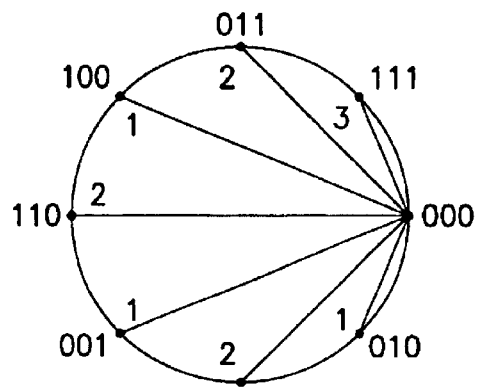
FIG. 4 depicts, in accordance with an aspect of this invention, one optimal bits-to-symbol encoding scheme for the 8PSK, 16-state space-time code case of FIG. 3B, wherein the lines indicate the bit error counts when '000' is the correct symbol.

More specifically, FIG. 4 shows one optimal bits-to-symbol encoding scheme for the 8PSK, 16-state space-time code case of FIG. 3B. The lines indicate the bit error counts when '000' is the correct symbol. This same pattern repeats around the constellation, and only a one bit error is the most probable symbol error event.

A simple calculation based on FIG. 3B shows that the number of bit errors is reduced by approximately:

(57700−48300)/57700=16% when the optimized method for the bits-to-symbol mapping block 14 is applied, as opposed to a conventional Gray encoding, as in FIG. 2, for the 16-state space-time coded transmission. It should be noted that this result is obtained before channel decoding, which also benefits substantially from the bit error rate reduction made possible by the teachings of this invention.

The particular constellation shown in FIG. 4 does not provide an opportunity for further optimization based on the second most probable errors made in favor of symbols at ±Π/2 radians from the correct symbol.

Figure 5:
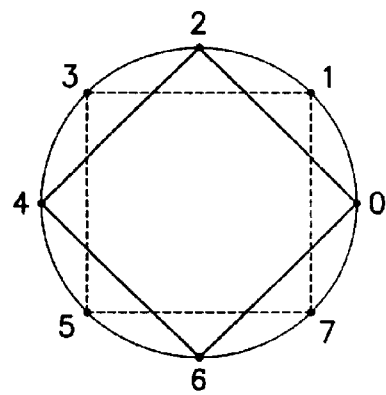
FIG. 5 shows one mapping optimization that can be employed to take into account second most probable symbol selection error events.

However, as an example of the mapping optimization which can be employed to also take into account the above-mentioned second most probable symbol selection error events, consider a hypothetical 8-PSK space-time code for which the most probable error is made in favor of symbols ±Π/2 radians from the correct symbol. Referring again to FIG. 2, in conjunction with FIG. 5, in this case symbol pair (0,2) should differ only in one bit position out of three. The same then holds true for symbol pairs (2,4), (4,6) and (6,0). These four symbols form a square in the constellation (shown with a solid line), with each corner of the square being assigned a bit pattern. The same optimization is also performed for symbol pairs (1,3), (3,5), (5,7), and (7,1), which again form a square (shown in dashed line) in the constellation figure.

It should be noted that these two squares can be freely mirrored or rotated with steps of ±Π/2 radians with respect to one another. The optimal mirroring or rotation is decided by determining for which symbols the errors are made with the second highest probability from each correct symbol.

Further in this regard, and as an example of a method to optimize the mapping based on the second most probable symbol error, assume 8-PSK modulation and that the most probable symbol error is made in favor of a symbol that is located at a distance of ±Π/2 radians. Based on the foregoing, an optimized mapping is shown in FIG. 6.

Figure 6:
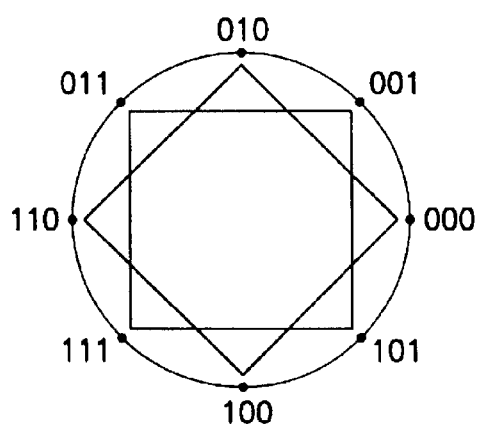
FIG. 6 depicts a signal constellation representing an optimized mapping for an exemplary 8-PSK modulation case, wherein a most probable symbol error is made in favor of a symbol that is located at a distance of $\pm\Pi/2$ radians.

If the second most probable symbol error is made in favor of a symbol ±3ℎ/4 radians apart, the mapping shown in FIG. 6 is not optimal, as a further optimization can be made. Note that the four points that are ±Π/2 radians apart form a square, and there are two such squares that can be used to illustrate the optimization in this case. The bit sequences in the corners of the squares are optimized with respect to one another based on the most probable error. If the second most probable error occurs, the mapping shown in FIG. 6 will result in two or three bit errors per such (second most probable) symbol error.

Figure 7:
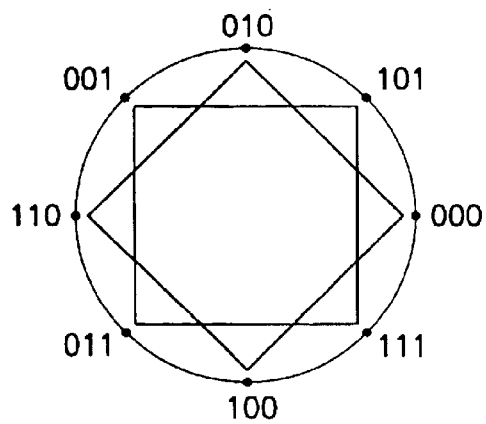
FIG. 7 depicts an optimized mapping for the case of FIG. 6, wherein it is assumed that a second most probable symbol error is made in favor of symbols $\pm\Pi/4$ radians apart, wherein only one or two errors are caused by the occurrence of the second most probable symbol error, while the occurrence of the most probable symbol error still results in only one bit error.

As such, FIG. 7 shows an optimized mapping for this case, wherein only one or two errors are caused by an occurrence of the second most probable symbol error, while an occurrence of the most probable symbol error (i.e., symbols ±Π/2 radians apart) still results in only one bit error.

In this example the further optimization depicted in FIG. 7 is made possible because the squares drawn inside the signal constellation can be flipped, mirrored, or rotated (with steps of ±Π/2 radians) independently of one another, without disturbing the optimization based on the occurrence of a most probable symbol error event. Of course, the symbol indexing remains the same (0, 1, 2 , . . . ,7), starting from '000' counterclockwise.

It should be noted that in most cases there may be several equivalently optimal solutions for the mapping problem.

Figure 9A:
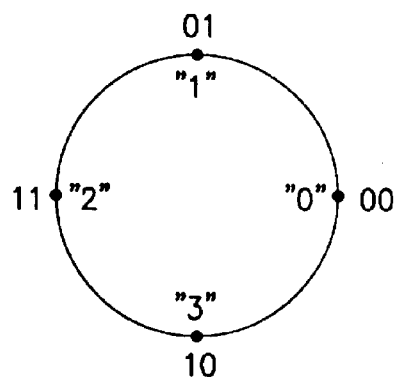
FIGS. 9A, 9B, 9C and 9D each depict an optimized bit-to-symbol mapping for a 4-state, 8-state, 16-state and 32-state space-time code for 4-PSK modulation and two transmit antennas, corresponding respectively to the tables 8A, 8B, 8C and 8D, where the Figures show the bit patterns assigned for each constellation point indexed as 0, 1, 2, 3.

Further by example, in FIG. 8A the counts of symbol errors between all possible symbol pairs are listed for an 4-state space-time code (STC) designed for 4-PSK modulation and the two transmitter antennas 19A and 19B. In this case it can be noticed that the most probable errors are made in favor of an adjacent symbol in the constellation. For this reason the traditional Gray encoding is optimal, shown in FIG. 9A, and no further optimization of the bit-to-symbol mapping is made. This is the expected result, as the 4-state code equals the delay diversity transmission which is seen by the receiver as a conventional single-antenna transmission with an increased channel delay spread, and because for such a system the conventional mapping is known to be optimal.

Figure 9B:
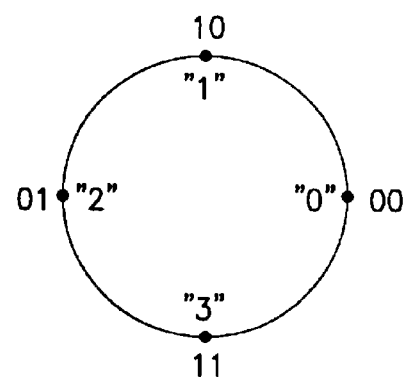

In the example of FIG. 8B the counts of symbol errors between all possible symbol pairs are listed for an 8-state space-time code (STC) designed for 4-PSK modulation and the two transmitter antennas 19A and 19B. An optimized bit-to-symbol mapping is shown in FIG. 9B. In this case it can be noticed that the optimization is also made based on the most probable error, although the effect of this optimization is small, and may vanish if a longer simulation were used to obtain the error counts.

Figure 9C:
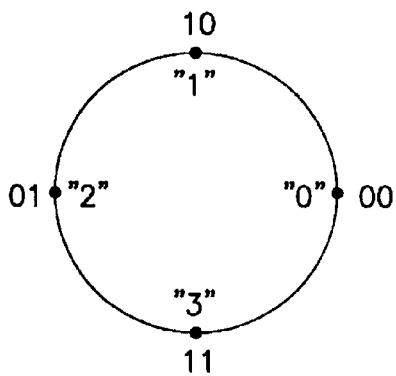

In the example of FIG. 8C the counts of symbol errors between all possible symbol pairs are listed for a 16-state space-time code (STC) designed for 4-PSK modulation and the two transmitter antennas 19A and 19B. An optimized bit-to-symbol mapping is shown in FIG. 9C. In this case it can be noticed that the optimization is also made based on the second most probable errors by selecting the bit patterns for symbols one and 3 appropriately after fixing the mapping for symbols zero and two. In this case the additional optimization has a significant impact on the total number of bit errors. It can also be noticed that in this case only the most rare symbol error is allowed to produce two bit errors, which is the maximum in the 4-PSK case. This can also be seen to be a goal of the bit-to-symbol mapping in this case.

Figure 9D:
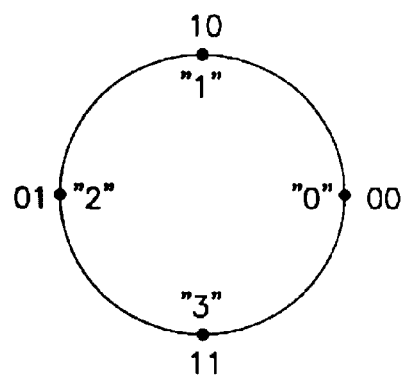

Finally, in the example of FIG. 8D the counts of symbol errors between all possible symbol pairs are listed for a 32-state space-time code (STC) designed for 4-PSK modulation and the two transmitter antennas 19A and 19B. An optimized bit-to-symbol mapping is shown in FIG. 9D. In this case it can be seen that the optimization is made based on the most and the second most probable symbol errors.

It can be appreciated that the block diagram of FIG. 1 can also be viewed as a logic flow diagram of a method in accordance with this invention. The method includes steps of providing a source of data bits (12); and bits-to-symbol mapping the data bits (14) using a predetermined signal constellation to provide bits-to-symbol mapped data bits. The bits-to-symbol mapper (14) is selected, in accordance with the teachings herein, such that a most probable symbol selection error made during a subsequent space-time decoding operation (24) results in a minimal number of bit errors. The method includes further steps of space-time encoding the bits-to-symbol mapped data bits (16) and transmitting them (18A, 19A, 18B, 19B) as a signal to a communications channel; receiving the space-time encoded, bits-to-symbol mapped data bit signal (20A, 20B, 22); space-time decoding the received signal (24); and symbol-to-bits mapping (26) the space-time decoded signal to provide a detected data bits output signal (26A).

As was made evident above, the bits-to-symbol mapping operation may be performed so as to consider only most probable symbol error events, or to consider the occurrence of most probable symbol error events as well as second most probable symbol error events, third most probable symbol error events, etc.

While described above in the context of specific modulation types, specific types of n-state space-time codes, specific numbers of antennas and the like, it should be appreciated that these are exemplary of the teachings of this invention, and should not be construed in a limiting sense upon the practice of the teachings of this invention.

Furthermore, it should be realized that if the optimal bits-to-symbol mapping is changed for some reason during operation, then suitable signalling is performed to inform the receiver 10B of the change, specifically the space-time decoder 24 and the symbol-to-bits mapper 26.

In general, the bits-to-symbol mapping optimization of this invention can be used whenever a particular code works on the symbol level, and where the bits-to-symbol mapping is not defined by the code. In conventional practice, the communications environment, interference, and the like does not affect the optimal mapping, and the conventional Gray encoding is always optimal. The teachings of this invention thus can beneficially address the case where the bits-to-symbol mapping problem results from the use of a space-time code itself.

As was also made evident above, the bits-to-symbol mapping operation may not always be optimized such that the most probable symbol error always results in only one bit error. That is, the most probable symbol error may sometimes cause two or more bit errors. In this case the bits-to-symbol mapping optimization preferably seeks to minimize the average number of bit errors caused by the most-probable symbol error. In many cases, however, the average number of bit errors per the most probable symbol error will be one, which is a desirable target number.

As such, while the invention has been particularly shown and described with respect to preferred and exemplary embodiments thereof, it will be understood by those skilled in the art that changes in form and details may be made therein without departing from the scope and spirit of the invention.

What is claimed is:

1. A method for performing a bit-to-symbol mapping operation, comprising steps of:
    determining a most probable symbol selection error made during a space-time decoding operation; and
    selecting a bits-to-symbol mapper such that the most probable symbol selection error made during the space-time decoding operation results in a minimal number of bit errors.

2. A method as in claim 1, and further comprising a step of providing a further optimization based on at least a second most probable symbol selection error.

3. A method as in claim 1, wherein a bits-to-symbol mapping operation performed by the selected bits-to-symbol mapper is followed by a space-time encoding operation.

4. A method as in claim 1, wherein the step of determining the most probable symbol selection error is comprised of a step of modelling a communications channel.

5. A method as in claim 1, wherein the step of determining the most probable symbol selection error is comprised of a step of considering a type of modulation used when transmitting the bits-to-symbol mapped signal through a communications channel.

6. A method for operating a space-time coded communications system, comprising steps of:
    providing a source of data bits;
    bits-to-symbol mapping the data bits using a predetermined signal constellation to provide bits-to-symbol mapped data bits, the bits-to-symbol mapping step being carried out so as to minimize an average number of bit errors resulting from an occurrence of at least a most probable symbol selection error during an operation of a space-time decoder;
    space-time encoding the bits-to-symbol mapped data bits and transmitting them as a signal to a communications channel;
    receiving the space-time encoded, bits-to-symbol mapped data bit signal;
    space-time decoding the received signal using the space-time decoder; and
    symbol-to-bits mapping the space-time decoded signal to provide a detected data bits output signal.

7. A method as in claim 6, where the bits-to-symbol mapping step is carried out so as to minimize an average number of bit errors resulting from an occurrence of the most probable symbol selection error, as well as from an occurrence of at least a second most probable symbol selection error, during the operation of the space-time decoder.

8. A method as in claim 6, wherein a bits-to-symbol mapper that executes the bits-to-symbol mapping step is selected based at least in part on a result of modelling the communications channel.

9. A method as in claim 6, wherein a bits-to-symbol mapper that executes the bits-to-symbol mapping step is selected based at least in part on a result of modelling the communications channel and a receiver of the space-time encoded, bits-to-symbol mapped data bit signal.

10. A method as in claim 6, wherein a bits-to-symbol mapper that executes the bits-to-symbol mapping step is selected based at least in part on a result of modelling the communications channel and on the operation of the space-time decoder.

11. A method as in claim 6, wherein a bits-to-symbol mapper that executes the bits-to-symbol mapping step is selected based at least in part as a result of a consideration of a type of modulation used when transmitting the signal through the communications channel.

12. A space-time coded communications system, comprising:
   a source of data bits;
   a bits-to-symbol mapping block for mapping the data bits using a predetermined signal constellation to provide bits-to-symbol mapped data bits;
   a space-time encoder block for space-time encoding the bits-to-symbol mapped data bits;
   a plurality of transmitters for transmitting the space-time encoded data bits to a communications channel;
   a receiver for receiving a space-time encoded, bits-to-symbol mapped data bit signal;
   a space-time decoder for decoding the received signal; and
   a symbol-to-bits mapping block for mapping the space-time decoded signal and providing a detected data bits output signal;
   wherein the bits-to-symbol mapping block is selected so as to minimize an average number of bit errors that result from an occurrence of at least a most probable symbol selection error made by said space-time decoder.

13. A system as in claim 12, where the bits-to-symbol mapping block is selected so as to minimize an average number of bit errors resulting from an occurrence of the most probable symbol selection error, as well from an occurrence of at least a second most probable symbol selection error, during the operation of said space-time decoder.

14. A system as in claim 12, where the bits-to-symbol mapping block is selected based at least in part as a result of modelling the communications channel.

15. A system as in claim 12, where the bits-to-symbol mapping block is selected based at least in part as a result of a consideration of a type of modulation used when transmitting through the communications channel.

16. A system as in claim 12, where the bits-to-symbol mapping block is selected based at least in part as a result of modelling the space-time decoder.

17. A system as in claim 12, wherein a change in the operation of said bits-to-symbol mapping block is signalled through said communication channel.

18. A system as in claim 12, wherein said plurality of transmitters transmit the space-time encoded data bits to the communications channel using an 8-state space-time code with one of 4-PSK or 8-PSK modulation.

19. A system as in claim 12, wherein said plurality of transmitters transmit the space-time encoded data bits to the communications channel using a 16-state space-time code with one of 4-PSK or 8-PSK modulation.

* * * * *